United States Patent
Söderbärg et al.

[11] Patent Number: 6,063,693
[45] Date of Patent: May 16, 2000

[54] PLANAR TRENCHES

[75] Inventors: Anders Söderbärg, Uppsala; Nils Ögren, Vallingby; Håkan Sjödin, Knivsta; Mikael Zackrisson, Rimbo, all of Sweden

[73] Assignee: Telefonaktiebolaget LM Ericsson, Stockholm, Sweden

[21] Appl. No.: 09/045,638

[22] Filed: Mar. 23, 1998

[51] Int. Cl.$^7$ .................................................. H01L 21/76
[52] U.S. Cl. .......................................... 438/432; 438/435
[58] Field of Search .................................... 438/424, 425, 438/427, 430–432, 435, 446, 471, 476, 320, 386–392

[56] References Cited

U.S. PATENT DOCUMENTS

| | | | |
|---|---|---|---|
| 5,175,122 | 12/1992 | Wang et al. | 438/427 |
| 5,561,073 | 10/1996 | Jerome et al. | 438/404 |
| 5,698,891 | 12/1997 | Tomita et al. | 438/476 |
| 5,792,685 | 8/1998 | Hammerl et al. | 438/243 |

FOREIGN PATENT DOCUMENTS

| | | |
|---|---|---|
| 57-187951 | 2/1983 | Japan . |
| 58-143548 | 11/1983 | Japan . |
| 2 207 281 | 7/1987 | United Kingdom . |

OTHER PUBLICATIONS

Wolf, S. "Silicon Processing for the VLSI Era, vol. II", Lattise Press USA, pp. 45–56, Fig. 2.34, 2.35, 1990.

*Primary Examiner*—Olik Chaudhuri
*Assistant Examiner*—Anh Duy Mai
*Attorney, Agent, or Firm*—Burns, Doane, Swecker & Mathis, L.L.P.

[57] ABSTRACT

Method for improving the topography over trench structures in which the provision of extra poly-semiconductor material e.g. polysilicon or nitrate or oxide in the regions of the trench edges and, if necessary, the subsequent oxidation of the extra material prevents the occurrence of regions of high mechanical stress.

7 Claims, 9 Drawing Sheets

PLANAR TRENCHES

TECHNICAL FIELD OF THE INVENTION

The present invention relates to trenches in semiconductor products having a substantially planar surface.

DESCRIPTION OF RELATED ART

In order to isolate components in integrated circuits from each other refilled trench structures have been developed. There are many different methods of forming such trenches. The most common methods for making filled trenches are described in Wolf, S., "Silicon Processing for the VLSI Era Volume II", pages 45–56, ISBN-0-961672-4-5, 1990, Lattice Press USA. The main steps are that a trench is etched into the silicon substrate surrounding each component to be isolated on a wafer. An isolating oxide layer is then deposited in the trench and on the silicon substrate to isolate the component from the surroundings. The trench is then filled by depositing polysilicon over the whole wafer to a thickness which is sufficient to fill all the trench structures. Thus the polysilicon is also deposited on the oxide layer on the planar surfaces of the silicon substrate between the trenches. This polysilicon is then etched away in order to expose the oxide layer on the planar surface. Some of the polysilicon over the trench is also removed by this etching. This leaves components in the form of an island of silicon surrounded by a trench of isolating polysilicon. In order to build up successive layers of components it is desirable that each successive layer of the integrated circuit is built upon a substantially planar surface. However, in practice, the removal of some of the polysilicon over the trench leaves a downward vertical step. The oxide walls of the trenches usually have sloping tops which incline downwardly towards the inside of the trench. Owing to this, the thickness of the polysilicon in the substantially planar polysilicon filling in the trench decreases as it approaches the trench walls. The polysilicon is then oxidised to form an isolating oxide cover over the trench. During this oxidisation it is possible that the silicon substrate in the regions near the trench edges which have only a thin covering of polysilicon is also oxidised. This produces high mechanical stresses in these regions. Subsequent processing often uses wet etching to remove thermally produced oxides. The etching speed for wet etching for oxides is greatly dependent on the mechanical stress in the oxides. This means that the oxides in regions of high mechanical stress are etched deeper than the rest of the surface leading to grooves along the edges of the trench. During further processing it is possible that these grooves become filled with conducting material to such a depth that later processing to remove undesirable conducting material is ineffective and strings of surplus conducting material remain in the grooves. These strings can cause problems such as short circuits particularly if the strings are so high that they contact conductors laid over the trench.

SUMMARY

An object of the present invention is to produce trenches surfaces which are more planar than previous trench surfaces. Another object of the invention is to provide a method for eliminating the problem of strings of surplus conducting material remaining in grooves along trench edges.

In accordance with the invention this object is accomplished by providing extra amounts of trench material along the edges of the trenches in order to prevent the occurrence of grooves along the trench edges. In the case of silicon-based processing this is done by depositing on to the trench filling material a layer of polysilicon, oxide, nitride or the like which is then etched back by an anisotropic etch i.e. an etching process which attacks the layer to be etched significantly faster in the vertical direction hand in the horizontal. This leaves extra material along the trench edges. This process can take place before or after the oxide layer is grown on the polysilicon in the trench. In the case of non-oxidisable material such as oxide or nitride the thickness of the extra material after etching should be approximately the same as the height of the downward vertical step. In the case of polysilicon, the thickness of the polysilicon deposited is preferably chosen such that when all of the extra polysilicon is oxidised during the subsequent oxidation the resulting oxide layer has approximately the same height as the step height. The extra material in the form of oxides nitride or polysilicon srings along the trench edges protect from oxidation the underlying silicon which otherwise would be oxidised and produce regions of high mechanical stress. In the absence of regions of high mechanical stress the subsequent wet etching proceeds more evenly and the production of unwanted grooves at the trench edges is avoided. By using the same type of material that is used to fill the trench as the extra material less mechanical stress is produced in the trench after oxidation.

The oxidation of the extra thickness of the polysilicon material near to the trench edges also provides a thicker oxide layer near to the trench walls. By choosing the correct dimensions for the extra polysilicon strings it is possible to produce oxides layers at the trench edges which are substantially the same thickness as the surrounding oxide layers and in this way achieve a more planar surface. By a suitable choice of deposition temperature it is possible to adjust the grain size of deposited silicon i.e. deposition at 580° C. produces amorphous silicon while deposition at 600° C. produces micro-crystalline silicon and deposition at 620° C. gives polycrystalline silicon. Amorphous silicon oxidises more quickly than micro-crystalline silicon which oxidises more quickly than polycrystalline silicon. It is therefore possible to adjust the relative oxidation rates of the trench material and the extra material to form a desired trench cross-sectional profile by adjusting the deposition temperature of the extra material.

A trench formation formed in accordance with the invention has a number of advantages. An obvious advantage is that the surface over the trench no longer has a vertical step which reduces the risk of undesirable material being trapped in the trench and later causing problems. An other advantage is that a more even planar surface is achieved after the oxide or nitride has been deposited or after the polysilicon has been deposited and etched back in a method according to the invention. A further advantage is that the mechanical stresses in the trench are reduced.

BRIEF DESCRIPTION OF THE DRAWINGS

The invention will be described in more detail below by means of examples of embodiments of trench structures formed according to the invention and with referenced to the appended drawings in which.

DETAILED DESCRIPTION OF THE EMBODIMENTS

Figure 1A:
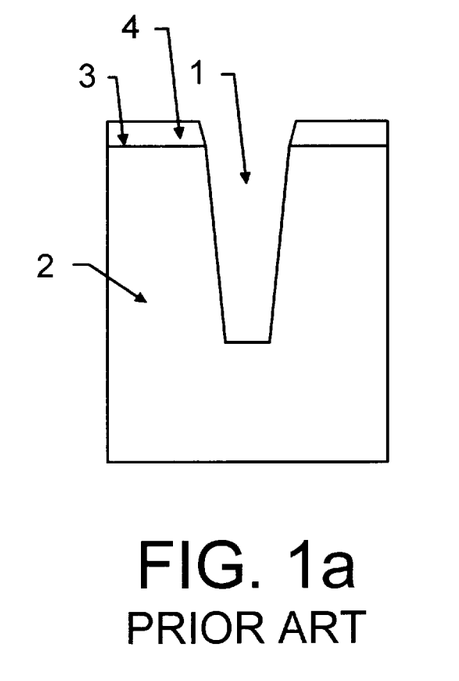
FIGS. 1a–1h shows in cross-section stages in the formation of a trench according to a prior art method; and, FIGS. 2a–2i shows in cross-section stages in the formation of a trench according to one embodiment of the present invention.

FIG. 1a shows the first stage in a known method of producing a trench. A trench 1 has been etched into a silicon substrate 2 of a wafer which has a planar surface 3. An isolation 1a layer 4 of, for example silicon dioxide or silicon nitride or a combination of these, on top of the planar surface acts as a mask during etching of the trench 1.

Figure 1B:
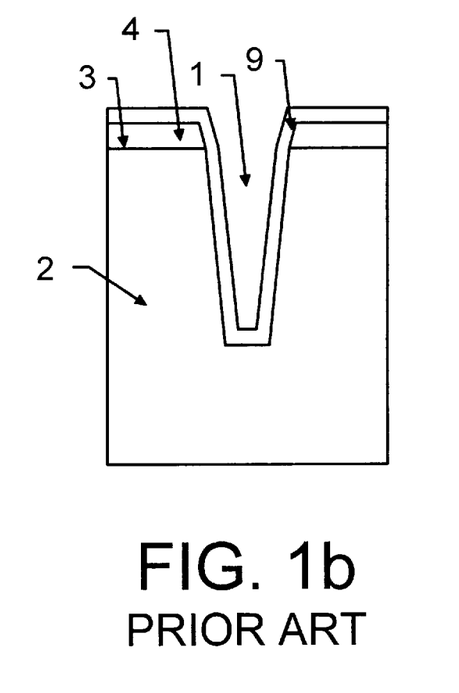
Figure 1C:
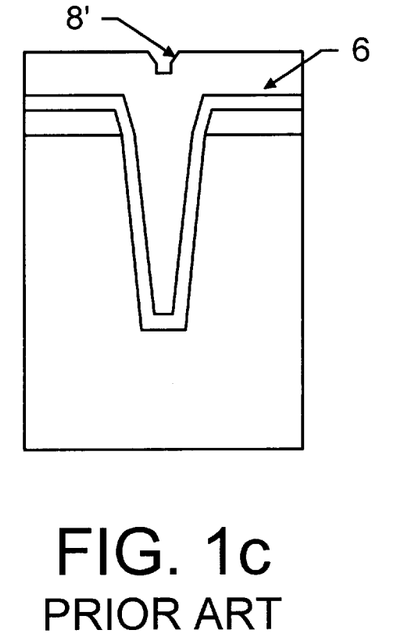

In FIG. 1b a second isolation layer 9 of, for example silicon dioxide or silicon nitride or a combination of these, has been grow or deposited in the trench 1 and on the first isolation oxide layer 4. It is also possible to deposit the isolation 1a layer 9 after the first isolation layer 4 has been removed from the planar surface 3. In FIG. 1c a polysilicon layer 6 has been deposited over substantially the whole of the silicon substrate 2 and in the trench 1 to a thickness which is sufficient to overfill the trench 1. A dip or vertically downward step 8' is present over the trench 1.

Figure 1D:
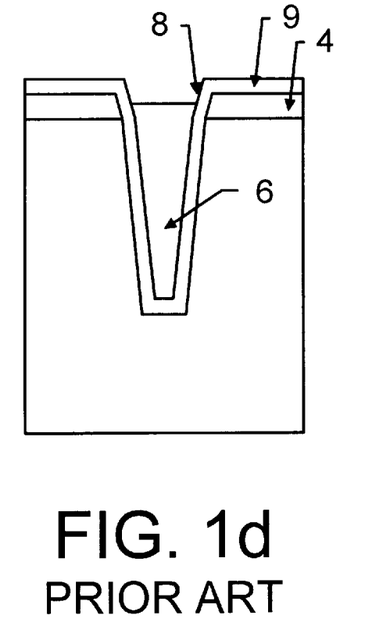

In FIG. 1d the polysilicon layer 6 has been etched away in order to expose the second insolation layer 9 on the substantially planar surface of the silicon substrate 2. This second insolation layer 9 is resistant to the etching. This leaves islands of silicon substrate 2 separated by a trench 1 with walls of isolating oxide and a core of polysilicon layer 6. When the polysilicon layer 6 is etched away from the wafer surface to expose the second insolation layer 9 a downward vertical step 8 remains over the trench 1. This is caused by over-etching of the polysilicon layer 6. This over-etching is required to ensure that all the polysilicon on top of the planar surface 3 is removed.

Figure 1E:
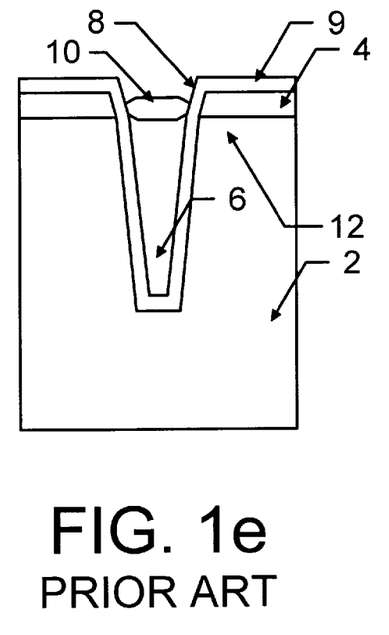

The surface of the polysilicon layer 6 remaining in the trench 1 is then oxidised to form an isolating oxide cover 10 over the trench as shown in FIG. 1e. The silicon substrate 2 in the regions 12 where the oxide walls of the trenches 1 have sloping tops which incline downwardly towards the inside of the trench has only a thin covering of polysilicon 6. During the oxidation process it is possible that the silicon substrate 2 is also oxidised, especially in the region where the cover oxide is thin prior to the oxidation step. This produces high mechanical stresses in regions 12 and in the oxide 9, 10 near these regions.

Figure 1F:
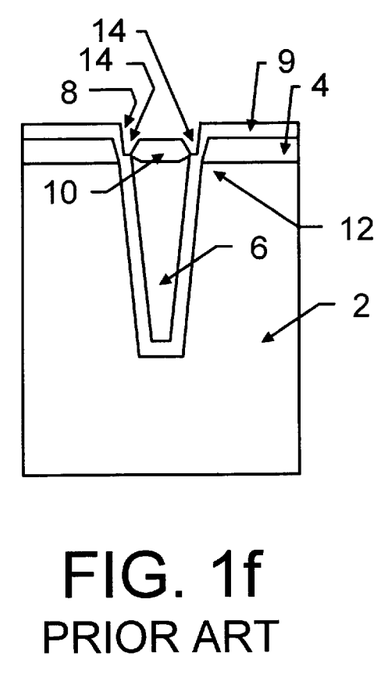

Subsequent processing often uses wet etching to remove thermally produced oxides such that the isolation layer 9 on the planar surface 3 is thinned or even removed entirely. In the event that isolation layer 4 is still present it is also conceivable that it is also, at least, partially thinned. The etching speed for wet etching for oxides is greatly dependent on the mechanical stress in the oxides. This means that the oxides in regions 12 of high mechanical stress are etched deeper than the rest of the surface, As shown in FIG. 1f this can leads to irregular grooves 14 along the edges of the trench 1.

Figure 1G:
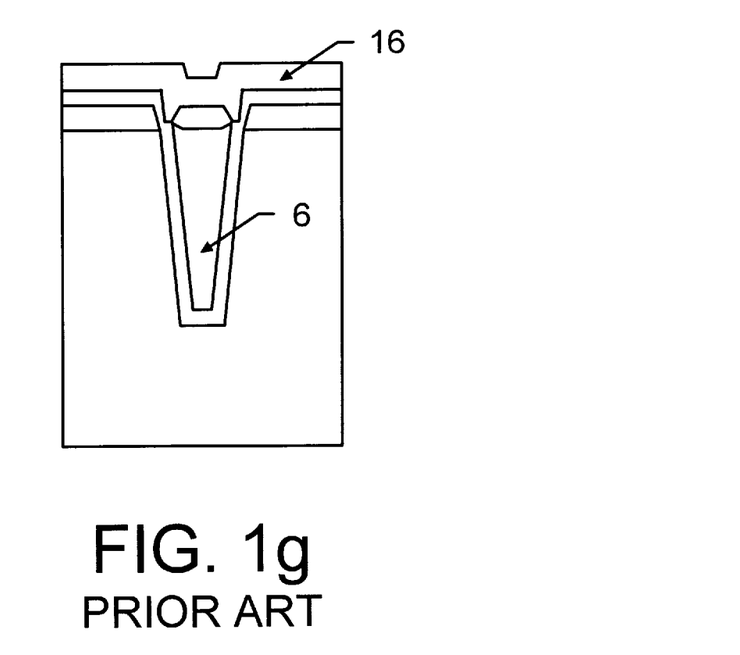

During subsequent processing including the deposition of conducting material 16 these grooves 14 become filled with conducting material 16 as shown in FIG. 1g.

Figure 1H:
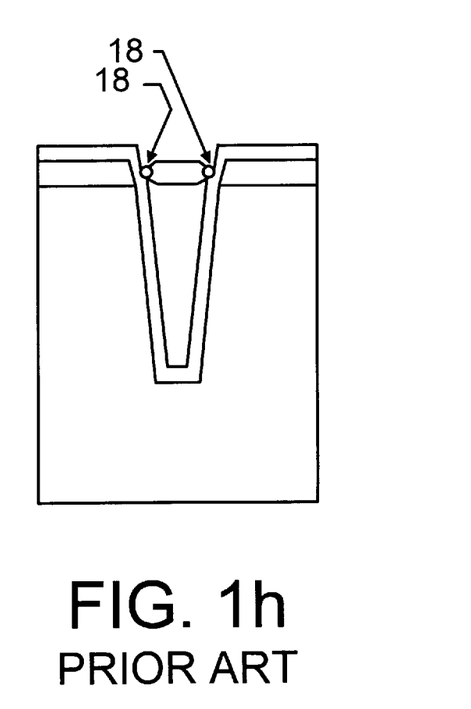

The duration of later processing to remove unwanted conducting material 16 may be insufficient to remove all the conducting material 16 at the bottom of the grooves 14 and strings 18 of surplus conducting material 16 may be left in the grooves as shown in FIG. 1h. These strings 18 can cause problems such as short circuits particularly if the strings are so high that they contact conductors laid over the trench during subsequent processing.

In an embodiment of the method according to the present invention for forming planar trenches, as illustrated in FIGS. 2a–2d, a trench is etched in the substrate in a conventional manner, for example, as described above with respect to FIGS. 1a–1d. For the sake of example the invention is illustrated by embodiments using a silicon substrate, silicon oxides as insulating material and polysilicon as a filling material. It is also conceivable to use other semiconductors e.g. silicon carbide or other group 3 or group 5 materials, or other suitable materials for the substrate and the insulating materials can be any suitable compounds such as oxides, nitrides or the like, and combinations thereof. Furthermore the trench filling material is not limited to polysilicon but could be, for example, amorphous silicon, micro-crystalline silicon or crystalline silicon compounds. In the event that the trench structure is formed in a substrate based on a material other than silicon is used then it is naturally possible to use other filling materials with the appropriate properties.

Figure 2A:
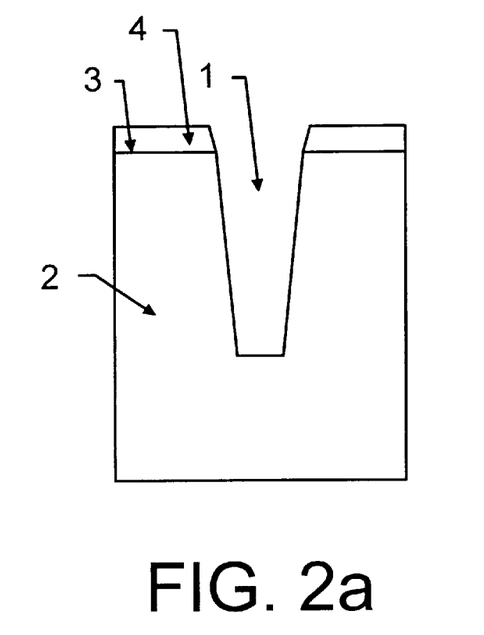
Figure 2B:
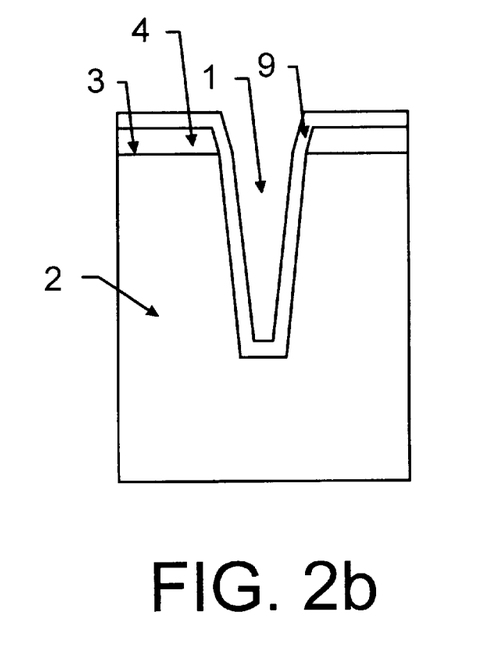
Figure 2C:
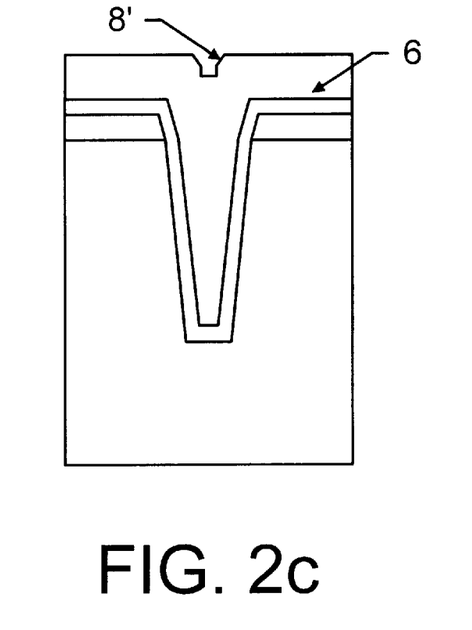
Figure 2D:
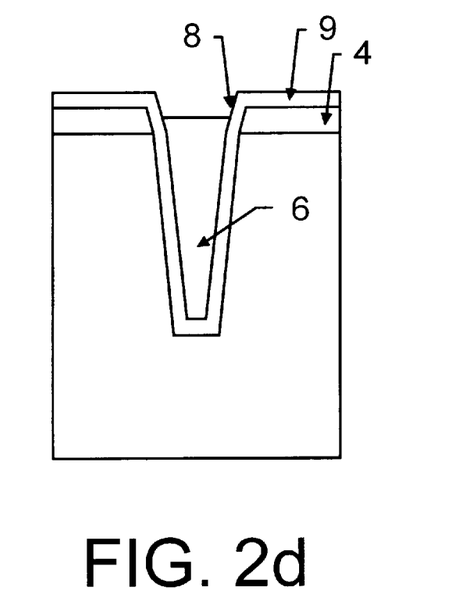
Figure 2E:
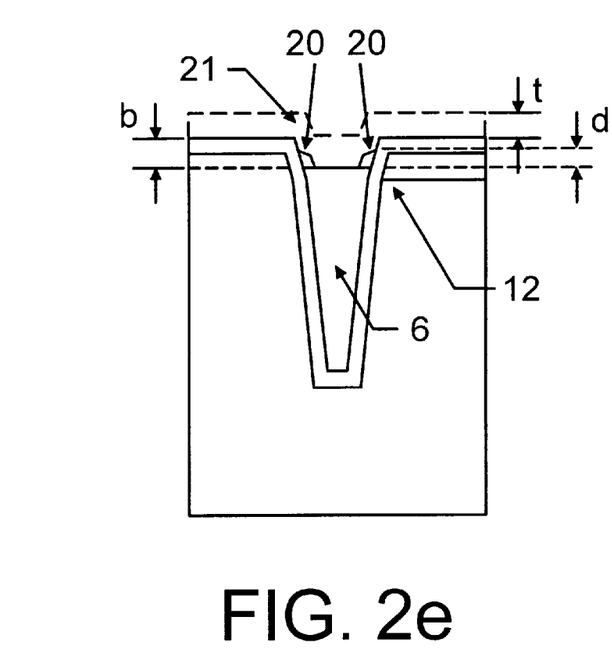

In FIG. 2e it can be seen that extra seams 20 of the same type of material that has been used to fill the trench, in this case polysilicon, have been laid along the edges of the trenches by any suitable method. One example of such a method is to first deposit a polysilicon film 21 of a thickness t of, for example, 0.3–0.8 Tm over the entire wafer. This polysilicon film 21 is deposited also directly onto the polysilicon layer 6 in the trench 1 and on the sides of the downward vertical steps 8 so that the vertical steps 8 are 2t closer to each other after the polysilicon film 21 has been deposited. The thickness t of this polysilicon film 21 is dependent on the height h of the downward vertical step of the trench. This polysilicon film 21 is shown by a dashed line in FIG. 2e. Polysilicon film 21 is then etched back a distance t with an anisotropic etch which etches primarily in the vertical direction.

This exposes the oxide isolation layer 4 and/or 9 on the planar surface and the polysilicon in the centre of the trench but leaves extra seams of polysilicon 20 along the trench edges where the vertical thickness of polysilicon film 21 is greatest.

Figure 2F:
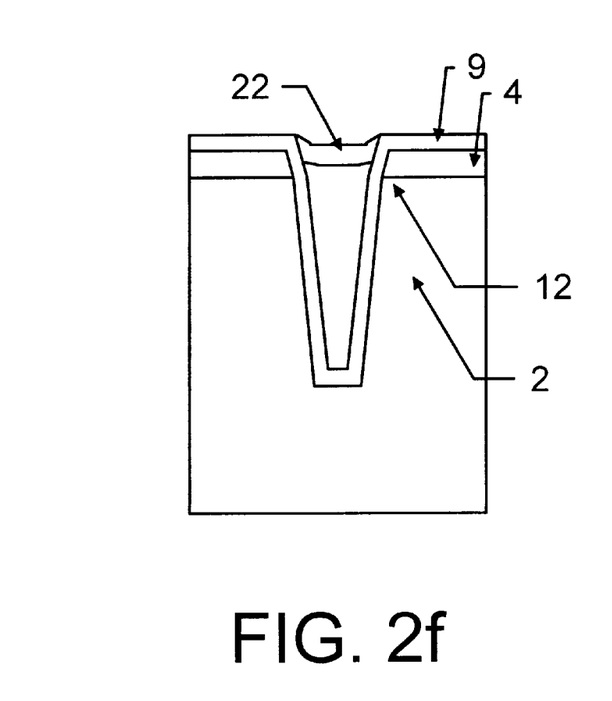

In a preferred embodiment of the invention the thickness t of polysilicon film 21 and the duration of the anisotropic etch is calculated to give a thickness d for the extra seams 20 such that after oxidation of the polysilicon in the seams 20, the resulting oxide layer has a thickness substantially equal to that of insulating oxide covering the silicon surface 3. The topography of the polysilicon 6, 20 is now such that there are no regions having only a thin covering of poly-silicon. The wafer is then oxidised in the conventional manner in order to form an isolating oxide cover 22 over the trench 1 from the exposed polysilicon 6, 20, as shown in FIG. 2f. As there is more polysilicon material available for oxidation in region 12 the silicon substrate in region 12 is not oxidised and regions of high mechanical stress do not occur. The more uniform thickness of the polysilicon layer before oxidising leads to a more uniform oxide layer . By varying the shape and dimensions of the extra seams of polysilicon 20 it is possible to produce an oxide layer which is substantially flat and coplanar with the exposed surface of the surrounding substrate. Furthermore, by a suitable choice of deposition temperature, it is possible to adjust the grain size of deposited silicon i.e. deposition at 580° C. produces amorphous silicon while deposition at 600° C. produces micro-crystalline silicon and deposition at 620° C. gives polycrystalline silicon. Amorphous silicon oxidises more quickly than micro-crystalline silicon which oxidises more quickly than polycrystalline silicon. It is therefore possible to adjust the relative oxidation rates of the trench material and the extra material to form a desired trench cross-sectional profile by adjusting the deposition temperature of the extra material.

Figure 2G:
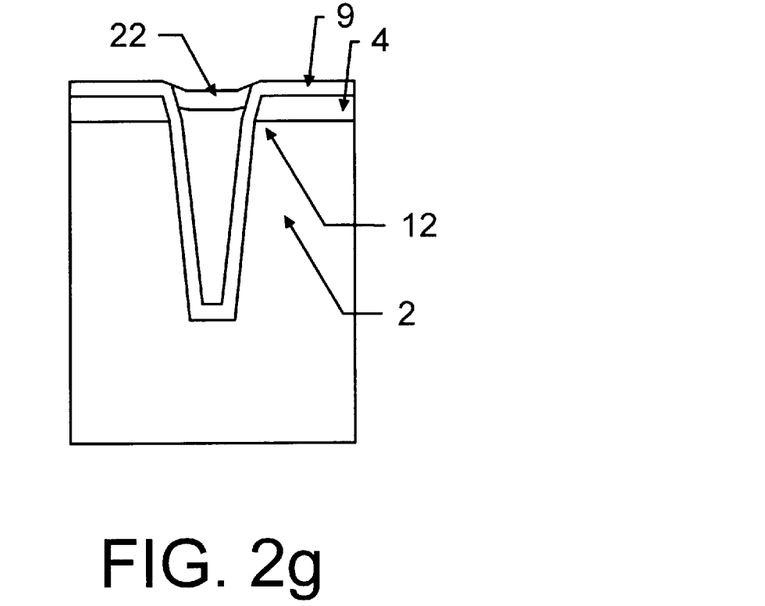

As shown in FIG. 2g, due to the absence of regions of high mechanical stress no grooves are formed during wet etching back of the thermal oxides.

Figure 2H:
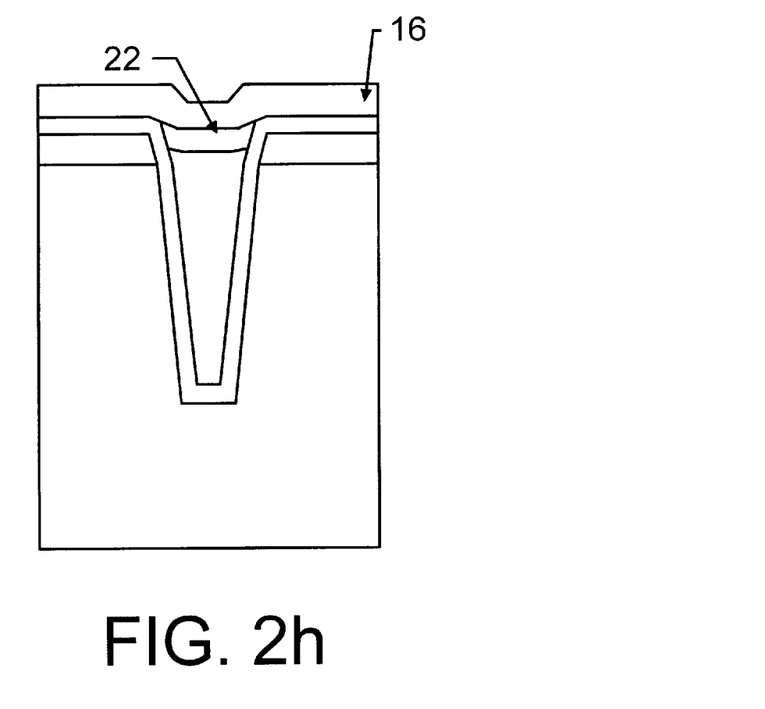
Figure 2I:
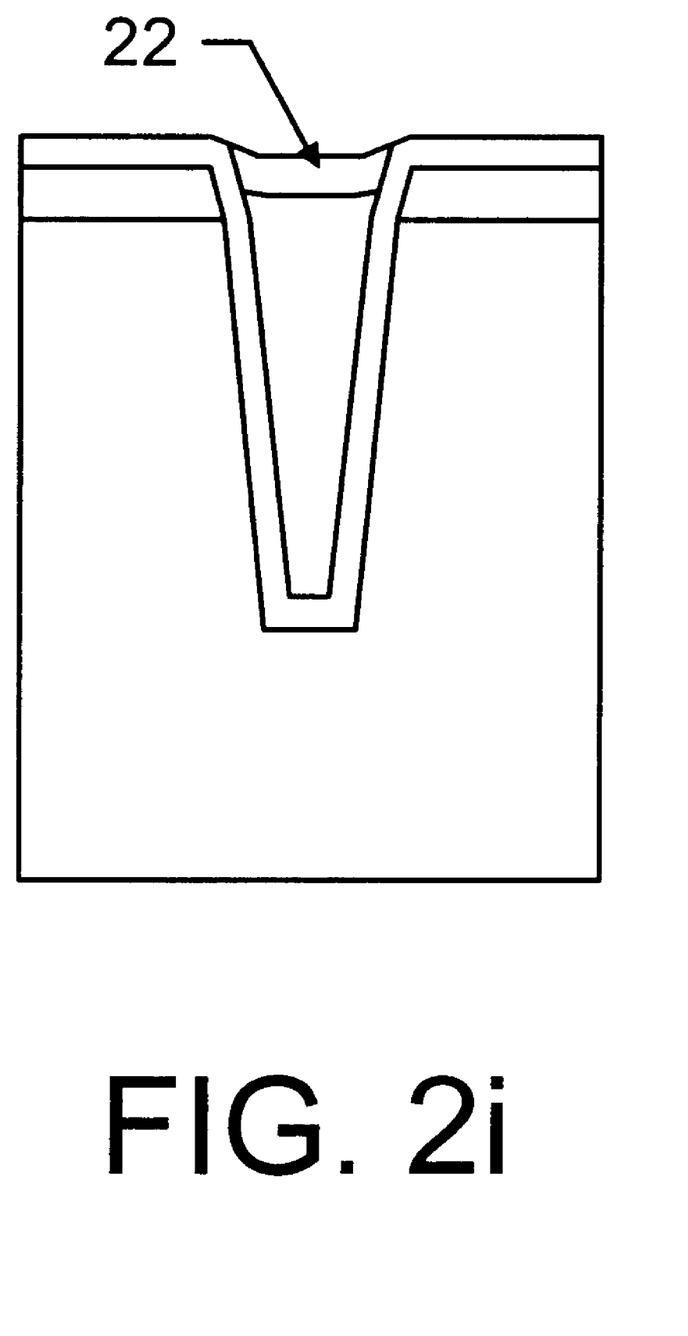

As shown in FIGS. 2h and 2i, any subsequent filling of conducting material 16 has a more even depth and removal of conducting material 16 can be performed without leaving strings of unwanted conducting material.

In a second embodiment of a method according to the present trenches are formed using the processes described above with reference to FIGS. 2a–2d. The polysilicon 6 in the trench is then oxidised to form a layer of silicon oxide before the extra seams 20 of material are laid along the edges of the trenches. This layer of silicon oxide acts as a stop layer with respect to further processing and prevents the underlying polysilicon 6 in the trench from being etched or oxidised in the following processing stages. The polysilicon is preferably oxidised at a comparatively low temperature in the region of 800° C. to 900° C.

In a third embodiment of the invention instead of polysilicon a further layer of oxide is deposited over the entire wafer, including the trench walls, after the steps of filling the trench with polysilicon and subsequent etching back of the polysilicon have been performed. The depth of this further layer is dependent on the height of the vertical step of the trench and the required height of the seams as described later. This oxide layer is then etched back to the earlier oxide layer with an anisotropic etch which etches primarily in the vertical direction thus leaving, as in the embodiment above, extra seams of material along the trench edges. The thickness of the extra seams (and thus the thickness of the deposited oxide layer) is chosen such that the remaining oxide layer along the trench edges has a thickness (height) substantially equal to that of the original insulating oxide layer and that the trench walls are displaced towards each other an amount sufficient to cover any regions of the trench edges which have a thin covering of polysilicon. If the thickness of each of the extra seams is greater than half the maximum trench width then the trench will be completely filled by these seams. After anisotropic etching-back a trench surface substantially coplanar with the surrounding exposed planar surface will be produced. These extra seams of oxide will not be oxidised during subsequent processing of the wafer and therefore will prevent high mechanical stresses arising near the trench edges.

In a fourth embodiment of the invention, a further layer of nitride is substituted for the further layer of oxide mentioned in the third embodiment of the invention. In a similar manner as described for the third embodiment, this nitride layer is deposited over the wafer and subsequently etched back.

In all the embodiments of the invention the isolating layers can be made from any suitable insulating material including such materials such as oxides, nitrides or the like of the substrate material.

The methods according to the invention are preferably performed after active components have been created on the substrate and after they have been protected from etching and oxidation by coverings of etch-resistant and oxidation-resistant material.

We claim:

1. A method for producing trenches in a substrate of semiconductor material having a planar surface, comprising the steps of:

masking the desired position of a trench in a planar surface of a substrate of a wafer by a mask;

etching the trench to a desired depth in the planar surface;

thermally oxidizing some or all of the exposed surfaces of the substrate to form a first isolation layer;

depositing a semiconductor layer on the first isolation layer, wherein the semiconductor layer has a thickness that is equal to, or greater than, the width of the trench;

etching back the semiconductor layer until the first isolation layer on the planar surface is exposed but the trench still contains the semiconductor layer;

whereby a substantially vertical downward step of height h is formed over said trench;

depositing a semiconductor film of the same type of material as the semiconductor layer over the exposed surfaces of the wafer and the semiconductor layer;

anisotropically etching back the semiconductor film so that the depth d of the semiconductor film remaining on the semiconductor layer in the trench in the region of the edges of the trench is less than or substantially equal to the height h of the step; and oxidizing the etched-back semiconductor film, wherein the thickness of the polysilicon film before being oxidized is adapted so that after being completely oxidized the resulting oxide layer is substantially coplanar with the exposed planar surface.

2. The method of claim 1, further comprising the step of oxidizing the semiconductor layer in the trench after the semiconductor film of the same type of material as the semiconductor layer over the exposed surfaces of the wafer and the semiconductor layer in the trench has been anisotropically etched-back.

3. The method of claim 1, wherein the semiconductor material is from group 3 or 5 of the periodic table.

4. The method of claim 1, wherein the semiconductor material comprises silicon.

5. The method of claim 1, wherein the semiconductor film and the semiconductor layer comprise poly-semiconductor material, amorphous semiconductor material, microcrystalline semiconductor material or crystalline semiconductor material.

6. The method of claim 1, wherein the first isolation layer is an oxide of semiconductor material.

7. The method of claim 1, wherein the mask is an oxide of semiconductor material that protects underlying surfaces from being etched and oxidized.

* * * * *